(12) United States Patent
Bosch et al.

(10) Patent No.: US 7,102,435 B2
(45) Date of Patent: Sep. 5, 2006

(54) AMPLIFIER ARRANGEMENT AND CONTROL LOOP HAVING THE AMPLIFIER ARRANGEMENT

(75) Inventors: Martin Bosch, Lonsee (DE); Johann Traub, Lauingen (DE)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 10/892,998

(22) Filed: Jul. 16, 2004

(65) Prior Publication Data

US 2005/0052239 A1 Mar. 10, 2005

(30) Foreign Application Priority Data

Jul. 24, 2003 (DE) ............................... 103 33 816

(51) Int. Cl.
*H03F 3/45* (2006.01)
(52) U.S. Cl. ...................................... 330/254; 327/359
(58) Field of Classification Search ................ 330/254; 327/359
See application file for complete search history.

(56) References Cited

U.S. PATENT DOCUMENTS 6,316,996 B1 * 11/2001 Puotiniemi .................. 330/254
6,657,494 B1 * 12/2003 Twomey ...................... 330/254

FOREIGN PATENT DOCUMENTS

JP 61033006 A 2/1986

OTHER PUBLICATIONS

"Bipolar and MOS Analog Integrated Circuit Design", A. Grebene, ISBN 0-471-08529-4, Figure 8.36, p. 446.

* cited by examiner

*Primary Examiner*—Steven J. Mottola
(74) *Attorney, Agent, or Firm*—Eschweiler & Associates, LLC

(57) ABSTRACT

An amplifier arrangement and also a control loop having the amplifier arrangement are specified, wherein the amplifier arrangement is based on a Gilbert multiplier. Connected in parallel in this case with one of the transistors of the differential amplifier cells is an additional transistor, at which it is possible to tap off a signal that is proportional to the gain factor. Processing this signal in a suitable manner, for example in a control loop, makes it possible to compensate for temperature and manufacturing fluctuations and also to obtain a highly linear characteristic curve having a gain factor which can be set in a stable manner. In addition, the structure shown is current-saving and can be used, in particular, for application in radio frequency technology as an amplifier having a variable gain factor (VGA).

10 Claims, 3 Drawing Sheets

AMPLIFIER ARRANGEMENT AND CONTROL LOOP HAVING THE AMPLIFIER ARRANGEMENT

REFERENCE TO RELATED APPLICATIONS

This application claims the benefit of the priority date of German application DE 103 33 816.0, filed on Jul. 24, 2003, the contents of which are herein incorporated by reference in their entirety.

FIELD OF THE INVENTION

The present invention relates to an amplifier arrangement and also to a control loop having the amplifier arrangement.

BACKGROUND OF THE INVENTION

In telecommunications, in particular radio frequency signal processing, the objective of generating a defined output level from a variable input level may frequently be encountered. Amplifiers having variable gain (which are also referred to as Variable Gain Amplifiers (VGA)) are normally used for this purpose.

VGAs of this type may have either a dB-linear or a voltage-linear characteristic curve, the latter being distinguished by the fact that they have a gain factor which is linear with respect to a reference variable, namely a control voltage.

The document by Alan Grebene: "Bipolar And MOS Analog Integrated Circuit Design", ISBN 0-471-08529-4 shows an example of a conventional VGA architecture in figure 8.36 on page 446. The so-called AGC (Automatic Gain Control) amplifier of broadband design shown there is based on the structure of a so-called Gilbert multiplier cell. In this case, provision is made of two differential amplifier cells which are connected in parallel on the control side, the desired gain being applied as a reference variable to the differential input formed in this way. The base points of the two differential amplifier cells are connected to outputs of a further differential amplifier, which likewise has control inputs having a differential input for a signal to be amplified. An amplified output signal—likewise present in differential form—can be discharged at the outputs of the two differential amplifier cells, said outputs being connected up to one another in a suitable manner. In other words, a radio frequency input signal which has been applied, at the base point, to the control inputs of the transistors of the differential amplifier is reversed in the quartet of four transistors of the differential amplifier cells. In this case, a variable signal current component from one transistor of each of the two differential amplifier cells is conducted to an electrical load, while the remaining partial currents of the respective other differential amplifier cell transistors are conducted directly to the supply potential and are thus discarded.

A structure of this type having a reference variable is usually driven using a so-called VGA buffer, to be precise in such a manner that the transistors of the differential amplifier cells are simulated there and are connected up as diodes in order to generate voltages via variable currents on their diode characteristic curves, said voltages in turn serving as a reference variable, namely as a control voltage for the gain of the amplifier having variable gain. The currents to be set are in turn controlled using a guide voltage (gain control voltage). A buffer structure of this type itself has a hyperbolic transfer function caused by the current-voltage conversion on the diode characteristic curves of the simulated transistors. If a linear behavior of the gain factor is desired, this is possible approximately only in a narrow central operating range.

In order to nevertheless achieve a wide dynamic range, a VGA could be embodied in a plurality of stages. However, this would be associated with the disadvantage of a large area occupation when embodied using integrated circuit technology in conjunction with a likewise disadvantageous high power consumption. However, the disadvantage of the single-stage embodiment explained is that, in the case of a high dynamic response requirement, the four transistors of the two differential amplifier cells of the Gilbert multiplier have to be reversed within a very wide range. This means that the diodes modeled on these transistors in the VGA buffer also have to be reversed within a wide range. If high attenuation of the radio frequency input signal is desired in this case, the output transistors and thus also one of the diodes assigned to the latter in the buffer must become virtually de-energized. However, in this virtually de-energized operating state, manufacturing fluctuations during the production of integrated circuits and also temperature fluctuations lead to particularly great changes in the gain factor selected. When the gain is considered logarithmically, this disadvantageous behavior has such an effect that it is practically no longer possible to correctly set a low gain. If the gain factor tends toward zero, the gain tends practically toward minus infinity.

Yet another disadvantage of the known structure described is that the diodes in the VGA buffer have to have the same current density as the quartet of transistors of the differential amplifier cells. If the VGA is to enable high output powers, the largest current component of the VGA buffer is in the two transistor diodes mentioned.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

An amplifier arrangement, which is of single-stage construction, is disclosed and affords a high dynamic response. In addition, the amplifier arrangement has a gain factor that can be set in a stable manner and exhibits a linear characteristic curve.

In accordance with one aspect of the invention, an amplifier arrangement comprises a Gilbert multiplier circuit having two inputs, one of which serves to set the gain and one of which serves as a radio frequency signal input, and having an output. The arrangement further comprises an additional transistor having a control terminal and a load terminal, which is connected to the control terminal and the load terminal of a transistor of the multiplier circuit, and having a further load terminal, which forms an additional output of the amplifier arrangement, for the purpose of providing a signal representing the gain of the amplifier arrangement.

The further load terminal of the additional transistor forms an additional output of the amplifier arrangement, it being possible to tap off, at said additional output, a signal representing the gain of the amplifier arrangement.

The additional transistor branches off a small portion of the signal current, which, in turn, is proportional to the presently set gain factor.

The additional output makes it possible to set the gain factor of the amplifier arrangement in such a manner that, in the case of a high dynamic response, a stable gain factor in conjunction with a simultaneously voltage-linear characteristic curve of the amplifier is ensured.

The amplifier arrangement may be arranged, for example, in a control loop, which regulates the gain factor.

Since the additional transistor always emits, at its additional output, a signal representing the present gain factor of the entire amplifier arrangement, it is additionally advantageously possible, in accordance with the proposed principle, to also compensate for temperature drift effects and also manufacturing variations and their effects on the gain factor.

The Gilbert multiplier circuit preferably comprises two differential amplifier cells, the base points of which are driven by a further differential amplifier.

The base points of the two differential amplifier cells are preferably understood as meaning their respective common emitter or source terminals.

The control terminal and one of the load terminals of the additional transistor are preferably connected to the control terminal and one of the load terminals of a transistor of one of the two differential amplifier cells of the Gilbert multiplier circuit.

In one aspect of the invention, the Gilbert multiplier circuit comprises a first and a second differential amplifier each having two transistors, the control terminals of which are connected to the input for setting the gain, and the Gilbert multiplier circuit comprises a third differential amplifier having two respective transistors. The control terminals of the transistors form a radio frequency signal input of the amplifier arrangement, and an additional transistor or a further additional transistor is assigned to each of the transistors of the first and second differential amplifiers.

In accordance with the above aspect, a total of four additional transistors are preferably provided in order to ensure greater symmetry of the entire circuit. In this case, the respective further load terminals of the further additional transistors are preferably connected to the supply potential terminal of the amplifier. As already explained, the additional output of the amplifier arrangement is formed in this case at one of the additional transistors, it being possible to tap off, at said additional output, a signal representing the gain of the amplifier arrangement.

The additional transistor and the further additional transistors preferably have smaller dimensions than the transistors of the first and the second differential amplifier and are accordingly of smaller size. This means that the additional transistor and the further additional transistors branch off only a very small portion of the signal current, with the result that the perturbation effects of the additional transistors on the amplifier arrangement remain relatively minor overall.

The four transistors of the first and the second differential amplifier are preferably connected up to the supply potential in such a manner that the load terminal of one transistor of each differential amplifier is directly connected to the supply potential and one load terminal of each further transistor in the first and second differential amplifiers is connected to the supply potential via an electrical load. The two last-mentioned transistors form the signal output of the amplifier arrangement at the connecting nodes to the electrical load. The additional transistor at which the additional output of the amplifier arrangement is formed is preferably assigned to one of those transistors of the differential amplifiers of the Gilbert multiplier to which said electrical load is connected and at which the signal output is formed.

The electrical load is preferably in the form of an impedance but a purely resistive load may also be provided.

The amplifier arrangement is preferably constructed using bipolar circuit technology, which affords, inter alia, the advantage of good suitability for particularly high signal frequencies.

As regards the control loop, the present invention comprises an amplifier and a regulating amplifier. The regulating amplifier couples the additional output of the amplifier arrangement to the input for setting the gain and compares the signal representing the gain of the amplifier arrangement with a reference variable and regulates the gain of the amplifier arrangement in a manner dependent on the comparison result.

Since a signal representing the gain of the amplifier arrangement is available at the additional output formed at the additional transistor of the amplifier arrangement, the gain factor may advantageously be set, in accordance with the proposed control loop, in a manner dependent on the reference variable.

Although manufacturing fluctuations during the production of the amplifier arrangement and also temperature fluctuations may affect the properties of the controlled system, namely of the amplifier arrangement, they are compensated for using the control loop. Only offsets of the amplifier possibly remain as residual errors, it being possible, however, to make said offsets small. It is thus ensured that the gain factor is set in a stable manner irrespective of temperature and manufacturing fluctuations. In addition, the gain factor of the amplifier follows the reference variable in a linear manner within its operating range. A VGA buffer having complicated diodes as described initially is no longer required in the control loop described, with the result that an additional advantage with regard to a particularly low power requirement is afforded.

Yet another advantage of the control loop resides in the fact that even fluctuations in the supply voltage have only extremely minor effects on the gain.

BRIEF DESCRIPTION OF THE DRAWINGS

The invention is explained in more detail below using a plurality of exemplary embodiments with reference to drawings, in which.

DETAILED DESCRIPTION OF THE INVENTION

Figure 1:
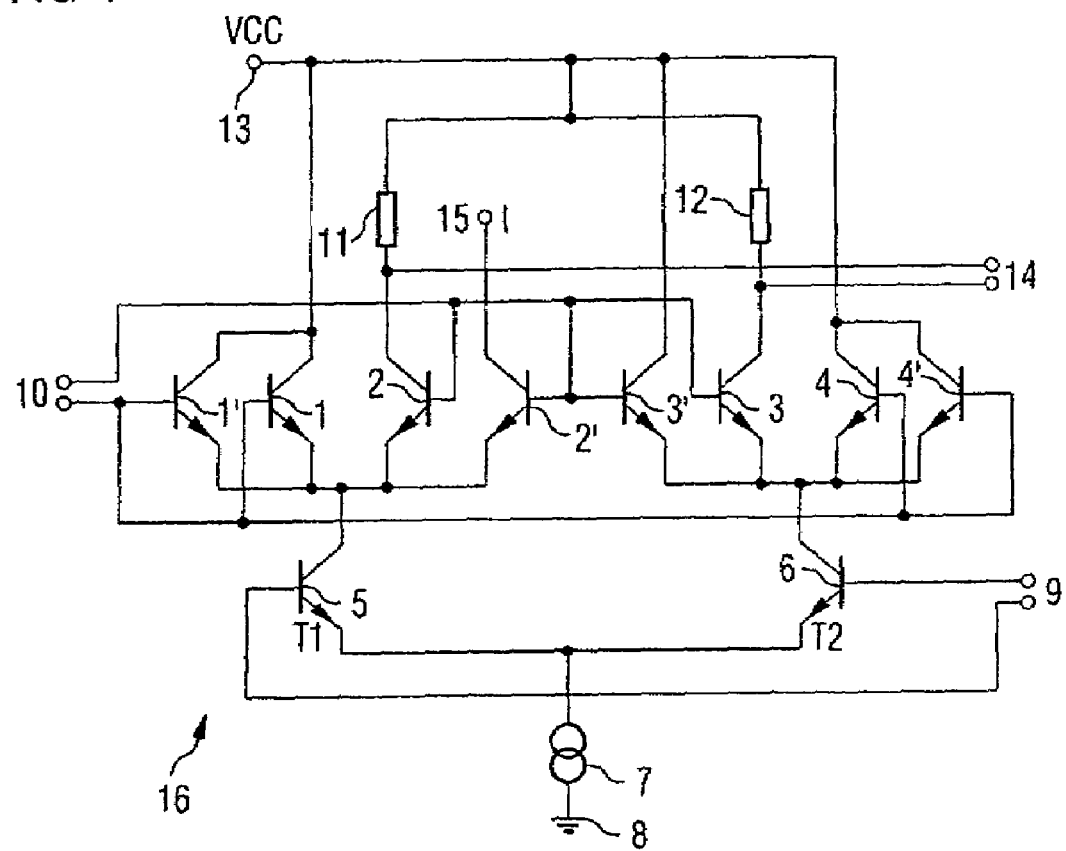
FIG. 1 shows a circuit diagram of an exemplary embodiment of an amplifier arrangement in accordance with an aspect of the present invention.

FIG. 1 shows the circuit diagram of an amplifier arrangement based on a Gilbert multiplier circuit. A first transistor and a second transistor 1, 2 are connected to one another on the emitter side and form a first differential amplifier. A second differential amplifier 3, 4 is formed by transistors 3, 4 which are likewise connected on the emitter side. The two emitter nodes are connected to respective collector terminals of further transistors 5, 6 which form a third differential amplifier. In this case, the emitter terminals of the transistors of the third differential amplifier 5, 6 are connected to one another and are connected to the reference potential 8 via a current source 7. The base terminals of the transistors 5, 6 of the third differential amplifier form the symmetrical radio frequency signal input 9 of the amplifier arrangement. A likewise symmetrical input 10 for setting the gain factor of the amplifier arrangement is formed at the base terminals of the transistors 1, 2; 3, 4 of the first and second differential amplifiers. To this end, the base terminals of the transistors 1 and 4 and also the base terminals of the transistors 2 and 3 are connected to one another. Whereas the collector outputs of the transistors 2 and 3 are connected to the supply potential 13 via an electrical load 11, 12 and at the same time form the symmetrical signal output 14 of the amplifier arrangement, the collector terminals of the transistors 1 and 4 are directly connected to the supply potential 13. A Gilbert multiplier circuit designed as an amplifier is thus formed.

An additional transistor 2', which is connected to the transistor 2 at the base and emitter terminals, is assigned to the transistor 2 in the first differential amplifier 1, 2. The collector terminal of the additional transistor 2' forms an additional output 15, at which a current I which is proportional to the present gain of the amplifier arrangement may be tapped off. For reasons of symmetry, a further additional transistor 1', 3', 4' is assigned to each of the other differential amplifier transistors of the first and second differential amplifiers 1, 2, 3, 4, said further additional transistors likewise being connected to the respective assigned transistor at the emitter and base terminals. The collector terminals of the further additional transistors 1', 3', 4' are connected to the supply potential terminal 13.

The additional transistor 2' and the further additional transistors 1', 3', 4' are dimensioned to be considerably smaller than the transistors 1, 2, 3, 4 of the first and second differential amplifiers.

The radio frequency input signal applied to the transistors 5 and 6 via the input 9 is reversed in the quartet of transistors 1 to 4. Reversal is effected in a manner dependent on the desired gain factor present as a reference variable at the input 10. In this case, a variable signal current component from the transistors 2 and 3 is conducted to the resistive load (used as an example here and designated by reference symbols 11, 12) and the remaining partial current from the transistors 1 and 4 is conducted directly to VCC and is thus discarded. In addition, an additional transistor 2' and also, for reasons of symmetry, further additional transistors 1', 3', 4' are introduced. The current I at the additional output 15 is proportional to the gain factor. The transistors 1', 3', 4' are present only for reasons of symmetry. Their currents are conducted directly to VCC. On account of their smaller dimensioning, the additional transistors and further additional transistors 1', 2', 3', 4' branch off only a small portion of the signal current.

A current which is proportional to the gain factor is available at the additional output 15, with the result that manufacturing and temperature fluctuations in the gain factor can be detected and, if appropriate, calibrated away without any problems. This makes it possible to achieve a gain factor which can be set in a stable manner and, in addition, makes possible a voltage-linear amplifier characteristic curve. On account of the single-stage embodiment of the VGA shown, operation of the amplifier with a low power consumption is ensured. In addition, a low area requirement results since only a single-stage amplifier is required and the additional transistors have small dimensions.

Instead of the embodiment using bipolar technology shown, it goes without saying that the circuit may also be implemented using metal oxide semiconductor circuit technology.

Figure 2:
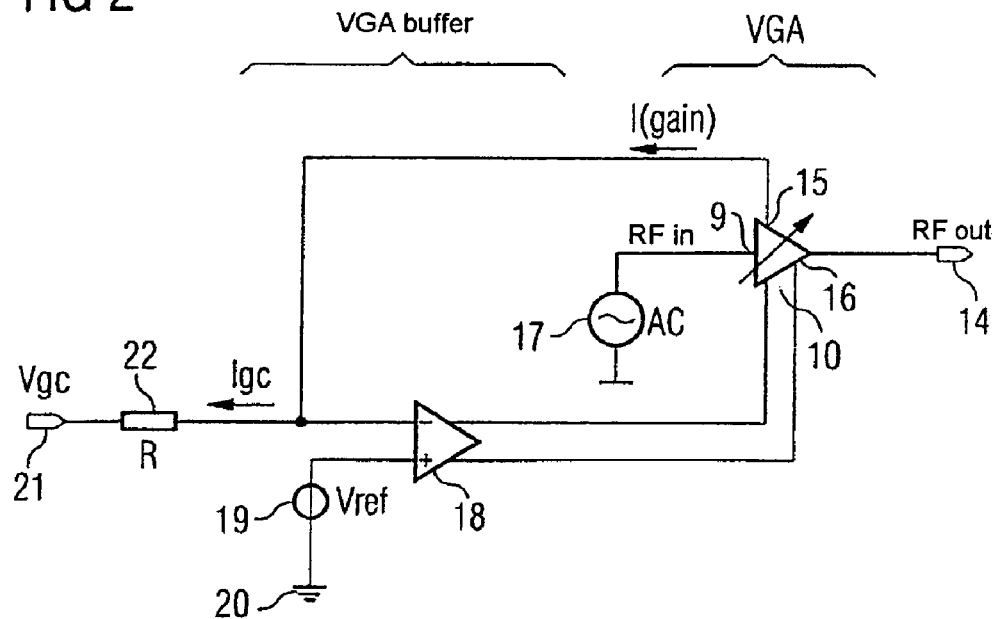
FIG. 2 shows an exemplary embodiment of a control loop having the amplifier arrangement of FIG. 1.

FIG. 2 shows the amplifier arrangement 16 of FIG. 1 embedded in a control loop by way of an example. A signal source 17 is connected to the radio frequency input 9 of the amplifier 16. The signal from the signal source 17, which has been amplified using the gain factor of the amplifier 16, is emitted at the output 14. The control input 10 of the VGA 16 is furthermore connected to the output of a conventional operational amplifier 18. The additional output 15 of the amplifier 16, at which the current which is proportional to the gain factor is emitted, is connected to the inverting input of the operational amplifier 18 in a negative feedback loop. The non-inverting input of the operational amplifier 18 is connected to the reference potential terminal 20 via a reference voltage source 19. A reference variable for the control loop can be applied to a reference variable input 21 in the form of a desired voltage signal VGC for the gain. The reference variable input 21 is connected to the inverting input of the operational amplifier 18 via a resistor 22, at which the guide voltage is converted into a current.

The operational amplifier 18 operates as a regulating amplifier and compares the signal I representing the gain of the amplifier arrangement with the reference variable VGC and regulates the gain of the amplifier 16 in accordance with the comparison result.

If, in the case of a CMOS operational amplifier, the input current of the amplifier is equal to zero or, in the case of a bipolar operational amplifier, is negligibly small, the current I at the additional output 15 corresponds to the current IGC. The current IGC corresponds to the difference between the reference voltage of the voltage source 19 and the voltage at the reference variable input 21 (relative to the resistance 22). Since the current I at the additional output 15 is proportional to the gain factor of the amplifier 16, the gain factor thus becomes proportional to the current IGC and the guide voltage $V_{GC}$. Although technological fluctuations or temperature fluctuations affect the properties of the controlled system 16, they are compensated for. The result is thus a gain factor which is set in a stable manner and follows the reference variable $V_{GC}$ in a linear manner within the operating range of the amplifier 16 until it reaches its minimum or its maximum, cf. FIG. 4 later on.

Since the proposed control loop does not require any diodes in a VGA buffer but rather a conventional operational amplifier 18 may be used to drive the VGA 16, the control loop shown is particularly current-saving.

In addition to the particularly low temperature coefficient and the compensation for manufacturing fluctuations, it is additionally advantageously possible to compensate for those variations in the gain factor which are caused by fluctuations in the supply voltage.

Figure 3:
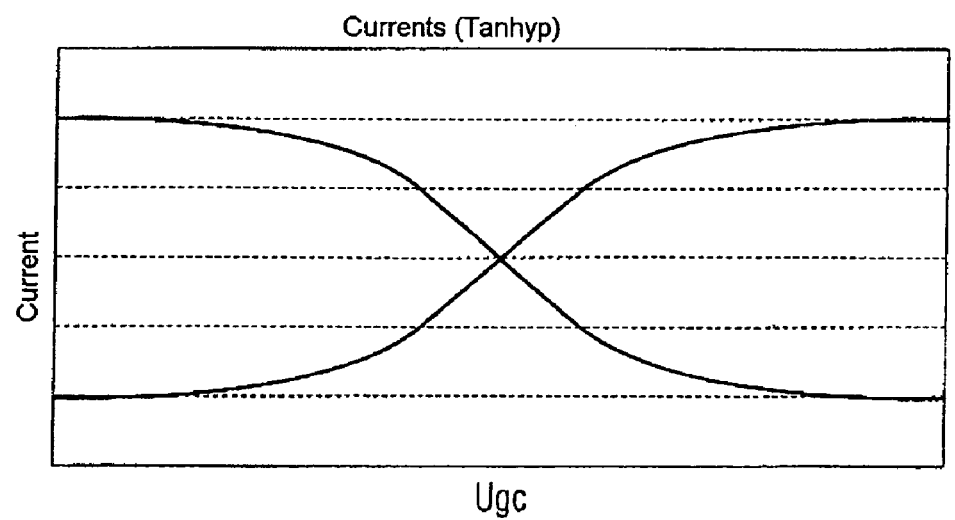
FIG. 3 shows a graph of the hyperbolic profile of the gain factor in the case of a VGA in accordance with the prior art.

FIG. 3 shows the collector currents of a conventional amplifier, which is based on a Gilbert multiplier and results in hyperbolic gain factors. It is evident that it is possible to achieve only a very small linear range.

Figure 4:
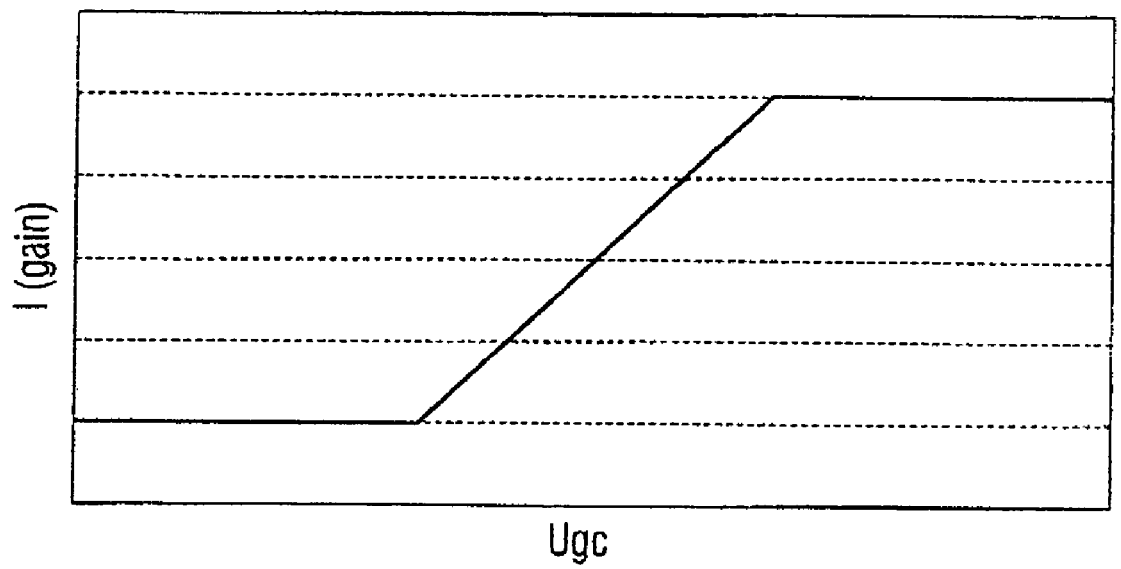
FIG. 4 shows the linear current profile at the additional output of the amplifier arrangement shown in FIG. 1.
Figure 5:
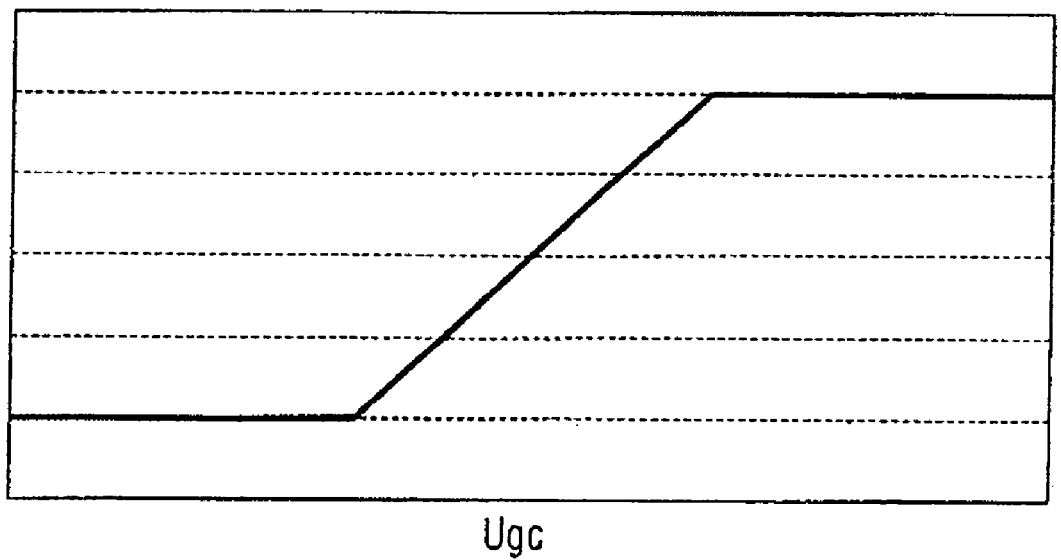
FIG. 5 shows the linear gain factor characteristic curve of the amplifier arrangement of FIG. 1.

However, in the present circuit, as shown in FIGS. 4 and 5, both the current I at the additional output 15 and, as a result thereof, the gain factor of the amplifier 16 are highly linear, relative to the reference variable $V_{GC}$ (or $U_{GC}$ in the figures) in each case. The gain factor follows the reference variable $V_{GC}$ in a linear manner within the operating range until it has reached its minimum or maximum. The minimum and also the maximum gain are determined by the amplifier arrangement itself and are respectively reached when the bias current of the amplifier arrangement has been completely reversed by means of the transistors 1 to 4.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

List of Reference Symbols

| | |
|---|---|
| 1 | Transistor |
| 2 | Transistor |
| 3 | Transistor |
| 4 | Transistor |
| 1' | Further additional transistor |
| 2' | Additional transistor |
| 3' | Further additional transistor |
| 4' | Further additional transistor |
| 5 | Transistor |
| 6 | Transistor |
| 7 | Current source |
| 8 | Refernce potential terminal |
| 9 | Radiofrequency input |
| 10 | Control input |
| 11 | Resistor |
| 12 | Resistor |
| 13 | Supply potential terminal |
| 14 | Radiofrequency output |
| 15 | Additional output |
| 16 | Amplifier arrangement |
| 17 | Signal source |
| 18 | Operational amplifier |
| 19 | Voltage source |
| 20 | Reference potential terminal |
| 21 | Reference variable input |
| 22 | Resistor |
| I | Current proportional to the gain factor |
| IGC | Control current |
| VGC | Control voltage |
| VREF | Reference voltage |
| R | Resistance |

The invention claimed is:

1. An amplifier arrangement, comprising:
a Gilbert multiplier circuit comprising first and second inputs, wherein the first input is configured to receive a signal to set a gain of the arrangement, and the second input is configured to receive a radio frequency signal input for amplification thereof, and wherein the Gilbert multiplier circuit further comprises an output for outputting an amplified radio frequency signal;
an additional transistor comprising a control terminal and a load terminal connected to a control terminal and a load terminal, respectively, of a transistor of the multiplier circuit, the additional transistor also comprising a further load terminal that forms an additional output of the amplifier arrangement configured to provide a signal representing a gain of the amplifier arrangement.

2. The amplifier arrangement as claimed in claim 1, wherein the Gilbert multiplier circuit comprises first and second differential amplifiers, each having two transistors comprising control terminals, wherein the control terminals are connected to the first input for setting the gain, and wherein the Gilbert multiplier circuit further comprises a third differential amplifier comprising two respective transistors comprising control terminals, wherein the control terminals of the third differential amplifier transistors form the radio frequency signal input of the amplifier arrangement, and comprising further additional transistors coupled to each of the transistors of the first and second differential amplifiers.

3. The amplifier arrangement as claimed in claim 2, wherein the additional transistor and the further additional transistors have smaller dimensions than the transistors of the first and the second differential amplifier.

4. The amplifier arrangement as claimed in claim 2, wherein one load terminal of each of the further additional transistors is coupled to a supply potential terminal.

5. The amplifier arrangement as claimed in claim 2, wherein one load terminal of each of the transistors of the first and second differential amplifiers is coupled to a supply potential terminal via a symmetrical electrical load, at which the output of the amplifier arrangement is formed.

6. The amplifier arrangement as claimed in claim 5, wherein the electrical load comprises an impedance.

7. The amplifier arrangement as claimed in claim 1, wherein the amplifier arrangement is constructed using bipolar circuit technology.

8. A amplifier arrangement of claim 1, in combination with a regulating amplifier, wherein the additional output of the amplifier arrangement is coupled to an input of the regulating amplifier and an output of the regulating amplifier is coupled to the first input of the amplifier arrangement for setting the gain thereof, wherein the regulating amplifier is configured to compare a signal at the additional output of the amplifier arrangement that is a function of the gain, to a reference variable, and provide an output signal at its output in response thereto, wherein the output signal regulates the gain of the amplifier arrangement.

9. An amplifier circuit, comprising:
a Gilbert multiplier circuit; and
a gain indication circuit connected to the Gilbert multiplier circuit, the gain indication circuit operable to generate a signal indicative of a gain of the Gilbert multiplier circuit, wherein the gain indication circuit comprises a transistor comprising a control terminal connected to a control terminal of a transistor of the multiplier circuit, the gain indication circuit transistor also comprising a load terminal that forms an additional output of the amplifier arrangement configured to provide a signal representing a gain of the amplifier circuit.

10. A loop circuit, comprising:
a Gilbert multiplier circuit;
a gain indication circuit connected to the Gilbert multiplier circuit, the gain indication circuit comprising a transistor and operable to generate a signal indicative of a gain of the Gilbert multiplier circuit; and a regulating amplifier, wherein the regulating amplifier comprises an output coupled to a gain adjustment input of the Gilbert multiplier circuit, and comprises an input coupled to an output of the gain indication circuit, wherein the regulating amplifier is operable to receive the signal indicative of the gain of the Gilbert multiplier circuit from the gain indication circuit and provide a control signal in response thereto to the gain adjustment input of the Gilbert multiplier circuit, thereby effectuating a substantially linear gain characteristic in the Gilbert multiplier circuit over a predetermined range.

* * * * *